(12) United States Patent
Desclos et al.

(10) Patent No.: US 10,530,064 B2
(45) Date of Patent: Jan. 7, 2020

(54) SWITCH ASSEMBLY WITH INTEGRATED TUNING CAPABILITY

(71) Applicant: Ethertronics, Inc., San Diego, CA (US)

(72) Inventors: Laurent Desclos, San Diego, CA (US); Olivier Pajona, Nice (FR)

(73) Assignee: Ethertronics, Inc., San Diego, CA (US)

( * ) Notice: Subject to any disclaimer, the term of this patent is extended or adjusted under 35 U.S.C. 154(b) by 0 days.

(21) Appl. No.: 16/197,908

(22) Filed: Nov. 21, 2018

(65) Prior Publication Data

US 2019/0097326 A1 Mar. 28, 2019

Related U.S. Application Data

(63) Continuation of application No. 14/631,801, filed on Feb. 25, 2015, now Pat. No. 10,141,655.

(60) Provisional application No. 61/944,071, filed on Feb. 25, 2014.

(51) Int. Cl.
| | | |
|---|---|---|
| *H01Q 21/00* | (2006.01) | |
| *H03J 5/22* | (2006.01) | |
| *H03J 5/24* | (2006.01) | |
| *H01Q 1/24* | (2006.01) | |
| *H01Q 21/30* | (2006.01) | |
| *H01Q 5/335* | (2015.01) | |

(52) U.S. Cl.
CPC ......... *H01Q 21/0006* (2013.01); *H01Q 1/243* (2013.01); *H01Q 5/335* (2015.01); *H01Q 21/30* (2013.01); *H03J 5/22* (2013.01); *H03J 5/244* (2013.01); *H03J 2200/06* (2013.01)

(58) Field of Classification Search
CPC .... H01Q 21/0006; H01Q 21/30; H01Q 5/335; H01Q 1/243; H03J 5/22; H03J 5/244
See application file for complete search history.

(56) References Cited

U.S. PATENT DOCUMENTS

| | | |
|---|---|---|
| 4,840,177 A | 6/1989 | Charbonnier |
| 8,072,285 B2 | 12/2011 | Spears |
| 8,421,548 B2 | 4/2013 | Spears |
| 8,995,936 B2 | 3/2015 | Desclos et al. |
| 9,231,669 B2 | 1/2016 | Desclos et al. |
| 9,590,703 B2 | 3/2017 | Desclos et al. |
| 9,641,201 B2 | 5/2017 | Bakalski |
| 10,141,655 B2 * | 11/2018 | Desclos ............. H01Q 21/0006 |

(Continued)

*Primary Examiner* — Stephen E. Jones
*Assistant Examiner* — Samuel S Outten
(74) *Attorney, Agent, or Firm* — Dority & Manning, P.A.

(57) ABSTRACT

A multiport RF switch assembly with integrated impedance tuning capability is described that provides a single RFIC solution to switch between transmit and receive paths in a communication system. Dynamic tuning is integrated into each switch sub-assembly to provide the capability to impedance match antennas or other components connected to the multiport switch. The tuning function at the switch can be used to shape the antenna response to provide better filtering at the switch/RF front-end (RFFE) interface to allow for reduced filtering requirements in the RFFE. Memory is designed into the multiport switch assembly, allowing for a look-up table or other data to reside with the switch and tuning circuit. The resident memory will result in easier integration of the tunable switch assembly into communication systems.

10 Claims, 12 Drawing Sheets

(56) References Cited

U.S. PATENT DOCUMENTS

| | | |
|---|---|---|
| 2008/0164464 A1 | 7/2008 | Kato |
| 2009/0117855 A1 | 5/2009 | Rofougaran |
| 2010/0073103 A1 | 3/2010 | Spears |
| 2010/0134257 A1 | 6/2010 | Puleston |
| 2010/0156552 A1 | 6/2010 | McKinzie, III |
| 2011/0086600 A1 | 4/2011 | Muhammad |
| 2011/0105023 A1 | 5/2011 | Scheer |
| 2011/0254751 A1 | 10/2011 | Bengtsson |
| 2012/0295554 A1 | 11/2012 | Greene |
| 2012/0302188 A1 | 11/2012 | Sahota |
| 2013/0005278 A1 | 1/2013 | Black |
| 2013/0069737 A1 | 3/2013 | See |
| 2013/0093634 A1* | 4/2013 | Rowson ............... H01Q 21/28 343/745 |
| 2013/0099993 A1 | 4/2013 | Tung et al. |
| 2013/0109333 A1 | 5/2013 | Rowson |
| 2013/0154897 A1 | 6/2013 | Sorensen |
| 2013/0187828 A1 | 7/2013 | Desclos et al. |
| 2013/0251010 A1 | 9/2013 | Alberth |
| 2013/0278477 A1 | 10/2013 | Dupuy |
| 2014/0004804 A1 | 1/2014 | Suh |
| 2014/0080409 A1 | 3/2014 | Frankland |
| 2014/0177686 A1 | 6/2014 | Greene |
| 2014/0184445 A1 | 7/2014 | Desclos et al. |
| 2014/0227982 A1* | 8/2014 | Granger-Jones ..... H04B 7/0404 455/77 |
| 2015/0340769 A1 | 11/2015 | Desclos et al. |

* cited by examiner

Look-Up Table

| Antenna Port | Tuning State | Freq Channel | Switch State | Use Case |
|---|---|---|---|---|
| 1 | $RF_1$ | $C_1$ | $S_1$ | $U_{11}$ |
|   | $RF_n$ | $C_n$ | $S_n$ | $U_{1n}$ |
| 2 | $RF_2$ | $C_1$ | $S_2$ | $U_{21}$ |
|   | $RF_n$ | $C_n$ | $S_n$ |   |
| 3 | $RF_1$ | $C_1$ | $S_1$ |   |

SWITCH ASSEMBLY WITH INTEGRATED TUNING CAPABILITY

CROSS-REFERENCE TO RELATED APPLICATIONS

The present application is a continuation of U.S. Ser. No. 14/631,801, filed Feb. 25, 2015, which claims benefit of priority with U.S. Provisional Ser. No. 61/944,071, filed Feb. 25, 2014; the contents of which are hereby incorporated by reference.

BACKGROUND OF THE INVENTION

Field of the Invention

This invention relates generally to the field of wireless communication; and more particularly, to switch modules and tuning circuits, and methods of dynamically adjusting RF communication system performance.

Description of the Related Art

As the need for higher data rates increases, communication systems are being designed to cover wider instantaneous frequency bandwidths. Also, with the introduction of 4G protocols such as Long Term Evolution (LTE) additional frequency bands are being used for cellular communication systems. In mobile communication systems, backward compatibility is required for cell phones being designed for 4G LTE applications such that the cell phone must be capable of operating at the 2G and 3G cellular bands as well as the 4G frequency bands. In addition, LTE as a protocol is configured to accommodate carrier aggregation, where multiple channels can be transmitted or received on simultaneously to increase instantaneous bandwidth. This aggregation of channels can cover up to five channels spread across multiple frequency bands. All of these trends point toward a growing need for more flexibility in the RF front-end of mobile communication systems to address the combining of multiple frequency bands and modes.

As more frequency bands are integrated into communication devices and are connected to more antennas that are being tasked to cover wider frequency ranges, implementing tunable RF front-ends and/or tunable antennas will bring additional complexity to the communication system design. The current invention addresses this problem of increased complexity and provides a unique set of capabilities to improve system performance along with simplifying the integration process.

DESCRIPTION OF EMBODIMENTS

Figure 1:
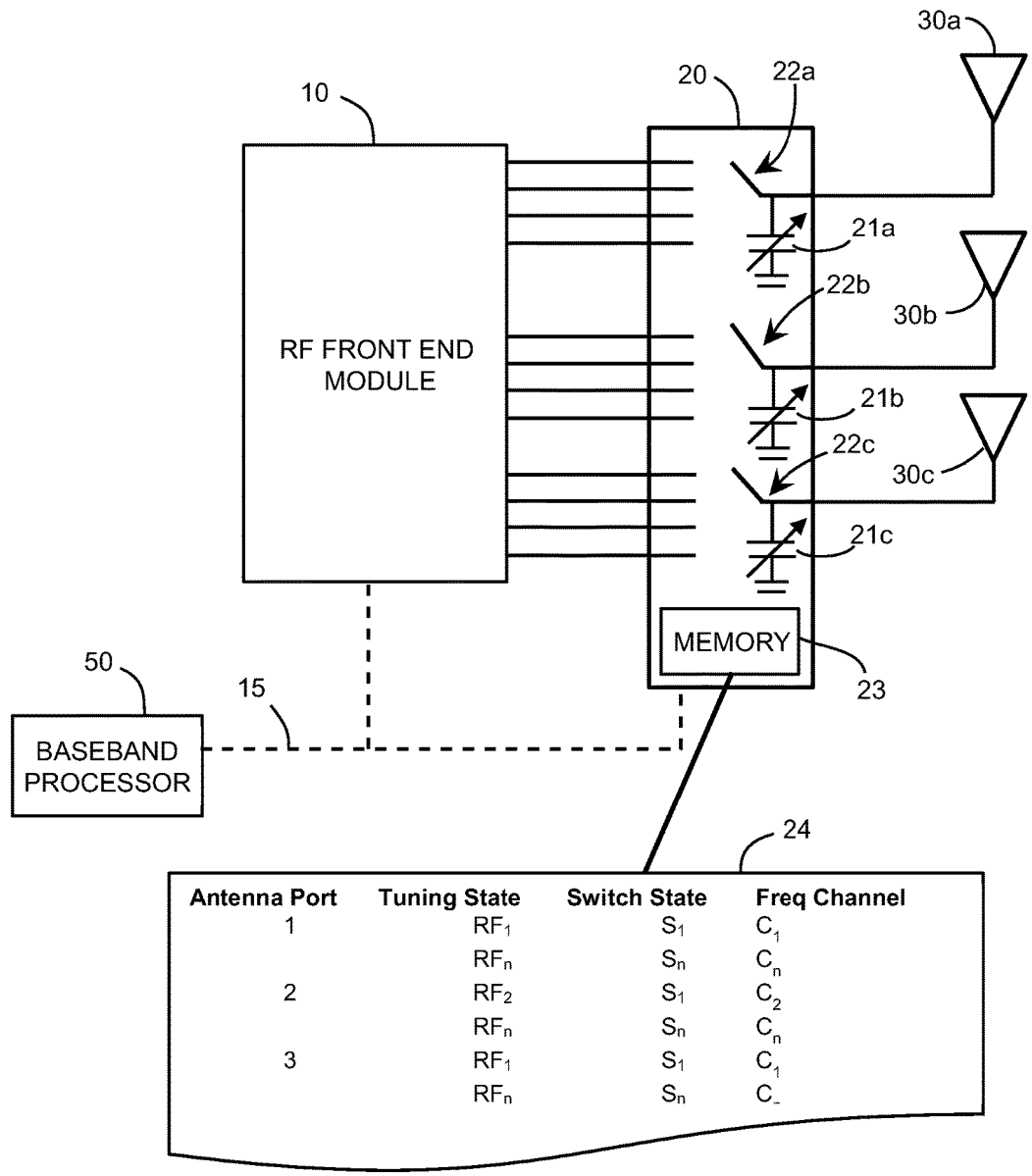
FIG. 1 shows an antenna tuning module comprising three multi-port switches coupled to antennas, a processor, and an RF front end module in accordance with an embodiment.

Dynamic tuning of antennas and radiofrequency (RF) front-ends of communication systems is picking up adoption in the commercial communications industry, and proper implementation of dynamic tuning methods can bring improvements to communication system performance as the number of frequency bands that can be accessed grows and the instantaneous bandwidths required increases. As antennas in mobile communication systems transition from passive types to active antenna systems to improve performance, additional performance can be achieved by combining the antenna tuning function with the switching function required to connect a single or multiple antennas to an RF front-end module. A combination of a multi-port switch assembly with a tuning capability in the same component can reduce circuit losses by eliminating transmission lines required to connect an individual switch to a tunable component such as a tunable capacitor. A savings in printed circuit board (PCB) space required to support the components can also be achieved.

Integrating a tunable capacitor with each switch in a multi-switch assembly provides the capability of tuning multiple antennas simultaneously. This is an important feature due to the increasing number of antennas integrated into communication devices such as cell phones. With LTE bringing the requirement of simultaneous operation of a two antenna MIMO system, having a tunable capacitor associated with each multi-port switch in the switch assembly allows for simultaneous optimization of both antennas during operation. This is important due to the physically different locations that the two antennas are positioned-in coupled with the typical use cases encountered during operation of a mobile communication device, such as a cell phone or tablet type device. For example, with a first LTE antenna located on or near the top of a cell phone and a second LTE antenna located near the bottom of the cell phone, a use case where the phone is in a user's hand, and the hand and phone are next to the user's head, will cause detuning of both antennas with the amount of detuning in terms of impedance variation and frequency shift typically being different for each of the two antennas. By providing separate tunable capacitors, one for each antenna, the problem of keeping both antennas tuned simultaneously can be solved.

An increase in the number of frequency bands required to be serviced in a mobile device that needs to operate at 2G, 3G, and 4G frequencies is bringing complications to the RF front-end of the communication system. Some RF front-end architectures are requiring separate low band (frequency bands that are in the 698 to 960 MHz range) and high band (frequency bands that are in the 1710 to 2700 MHz range) antennas instead of a single multi-resonant antenna capable of servicing both low and high band frequencies. For most use cases, the amount of de-tuning will vary as a function of frequency. A tuning capacitor associated with each switch in a multi-switch assembly, where one switch is assigned to the low band antenna and one switch assigned to the high band antenna, provides the capability to tune both low band and high band antennas simultaneously. This simultaneous tuning capability is important to provide improved antenna system performance during hand-off between frequency bands, and will become even more important as carrier aggregation is implemented. Carrier aggregation requires the use of multiple channels simultaneously to improve instantaneous bandwidth, with the multiple channels residing in a single frequency band or in multiple frequency bands. Low and high band channel pairings are required, and the individual tunable capacitor associated with each switch provides the needed simultaneous tuning capability.

Implementing an active antenna technique or a tuning technique to dynamically tune or adjust an RF front-end in a communication device requires control signals to control the tuning function. Open loop and closed loop tuning techniques are available, with both techniques typically requiring some information from the communication system. Open loop antenna tuning will typically require a look-up table which contains tuning state information as a function of frequency, use case, and other sensor information. Closed loop antenna tuning will typically require an algorithm to control components to converge to a matched condition for impedance tuning, or will require an algorithm to select the optimal radiation pattern in a smart antenna or beam-steering antenna system. This information could include frequency of operation, power level, and/or receive signal strength metrics such as receive signal strength indicator (RSSI). The look-up table will require memory for storage in the communication device. The memory can be located in on-board processors within the communication device, and the locating of memory and loading of the look-up table representing another step in the implementation in the tuning function.

In one embodiment herein, a system and method of combining multiple n-port switches and tuning functions associated with each n-port switch along with memory to provide a flexible switching and tuning interface between the antenna system and RF front-end (RFFE) in a communication system is described. The multiple switches in the system enable the use of multiple antennas or multi-feed antennas. Multiple antennas can be used to replace a single wide bandwidth antenna in a 3G/4G smartphone for instance, with the multiple antennas being used to service the large number of frequencies required of the primary and/or secondary antennas. Integrating a tuning capability with each n-port switch provides the capability of simultaneously tuning multiple antennas in a communication system. Integrating memory into the multi-port switch assembly will allow for a look-up table or other information specific to the switch assembly to be resident in the assembly to simplify integration of the switch assembly into a larger system.

Another embodiment includes an RF integrated circuit (RFIC) including a switch assembly containing three multi-port switches, with a tunable capacitor associated with each multi-port switch. The three multi-port switches allow for three antennas to be connected to the switch assembly, with the switch assembly in turn connected to a transceiver circuit. The three antennas can be designed to serve different frequency bands, with one antenna designed to cover low frequency bands, the second antenna designed to cover middle frequency bands, and the third antenna designed to cover high frequency bands. The tunable capacitor associated with each four-port switch can be used to work in conjunction with a passive matching circuit located between the switch port and the antenna feed port to provide a tunable matching circuit for the antenna. This architecture allows for simultaneous tuning of multiple antennas, and ensures that each antenna can be dynamically tuned for the frequency band of interest. A look-up table, resident in memory in the switch assembly, can be used to define and associate antenna tuning states with switch tuning states. One benefit of having the look-up table in the RFIC is the lack of requirement for the host communication device to provide memory for population of the look-up table. This will also reduce the time and complexity of integrating an active antenna system into a communication device since the look-up table can be loaded in the RFIC prior to installation of the RFIC in the communication system.

In another embodiment one of the multi-port switches, for example the switch used in conjunction with the high frequency antenna port, can be configured such that the tunable capacitor is eliminated. This results in a less complex switch assembly where three multi-port switches are used long with two tunable capacitors. The high frequency antenna will typically not require tuning to cover required or assigned frequency bands in most cellular or mobile applications. Simultaneous tuning of the low-band and mid-band antennas is achieved with each of the two tunable capacitors associated with two of the switches in the switch assembly.

In another embodiment low frequency transmit bands, such as Bands 12/13/14/17, can be grouped onto a first multi-port switch, and the low frequency receive bands can be grouped onto a second multi-port switch. This configuration allows for the tunable capacitor to optimize the impedance match of the low frequency transmit antenna to the power amplifier and other components in the transmit portion of the transceiver connected to the switch assembly. The tunable capacitor associated with the second multi-port switch used for the low frequency receive antenna can be used to impedance match the low frequency antenna to the receive portion of the transceiver. This configuration will provide for optimized impedance matching at both transmit and receive frequency bands in Frequency Division Duplex (FDD) systems. A look-up table resident in the memory of the switch assembly can be populated with information associating the switch ports and tunable capacitor tuning states such that the low frequency transmit antenna and low frequency receive antenna are simultaneously optimized. The switch assembly can contain additional multi-port switches to service additional frequency bands, with each switch having a tunable capacitor associated with it for tuning functions.

In another embodiment the tunable capacitor associated with a multi-port switch can be used along with one or more passive components such as capacitors or inductors, to form a low pass, band pass, or high pass filter. This filter can be used to shape the frequency response of the antenna connected to the four-port switch to increase the rate of roll-off of the frequency response of the combination of the antenna and filter. This technique can be used to allow for the relaxing or modification of filter requirements in the RF front-end (RFFE) that is connected to the switch assembly. Better filtering is achieved at the antenna switch interface which can be used to improve overall system filtering characteristics. For Frequency Division Duplex (FDD) systems this filtering at the antenna switch interface can provide a method to allow for relaxing duplexer specifications, which can result in cost and space savings as well as reduced insertion loss in the RFFE.

In yet another embodiment, two antennas operating at the same frequency band simultaneously can each be connected to one of two multi-port switches in the switch assembly. Each switch in the switch assembly has a tunable capacitor associated with it for antenna impedance tuning. At the output ports of the switch assembly that interface with the RFFE a passive or tunable component or circuit can be used to connect the output ports of the two multi-port switches. This passive or tunable component will effectively combine the two antennas together prior to interfacing with the RFFE. With the antenna ports combined, one or both of the tunable capacitors can be used to dynamically adjust the impedance such that the isolation between the two antennas is altered. Additional passive and/or active components can be connected between the antenna and switch port to form a circuit topology to adjust the amplitude and/or phase characteristics to improve isolation between the two-antenna system. In particular, this design can be used to improve isolation between the two antennas at the frequency band of operation.

Those skilled in the art will appreciate that various embodiments discussed above, or parts thereof, may be combined in a variety of ways to create further embodiments that are encompassed within the spirit and scope of the invention as set forth in the claims.

Now turning to the drawings, certain variations and embodiments are described in FIGS. 1-12B, wherein certain commonly held components are described with various reference signs. A list of reference signs is appended below for quick-reference. FIG. 1 illustrates an antenna tuning module 20 comprising three multi-port switches 22a; 22b; 22c, respectively. Each multi-port switch has a tunable capacitor 21a; 21b; 21c associated with it. Memory 23 is resident in the antenna tuning module 20 (also referred to as a switch assembly 20). The three multi-port switches are each connected to an RF front-end module 10, and each of the switches is further connected to a respective antenna 30a; 30b; 30c. Control signals 15 for the RF front-end module as well as the switch assembly are provided by a baseband processor 50. A look-up table 24 is illustrated with tuning state, switch state, and frequency channel information.

Figure 2:
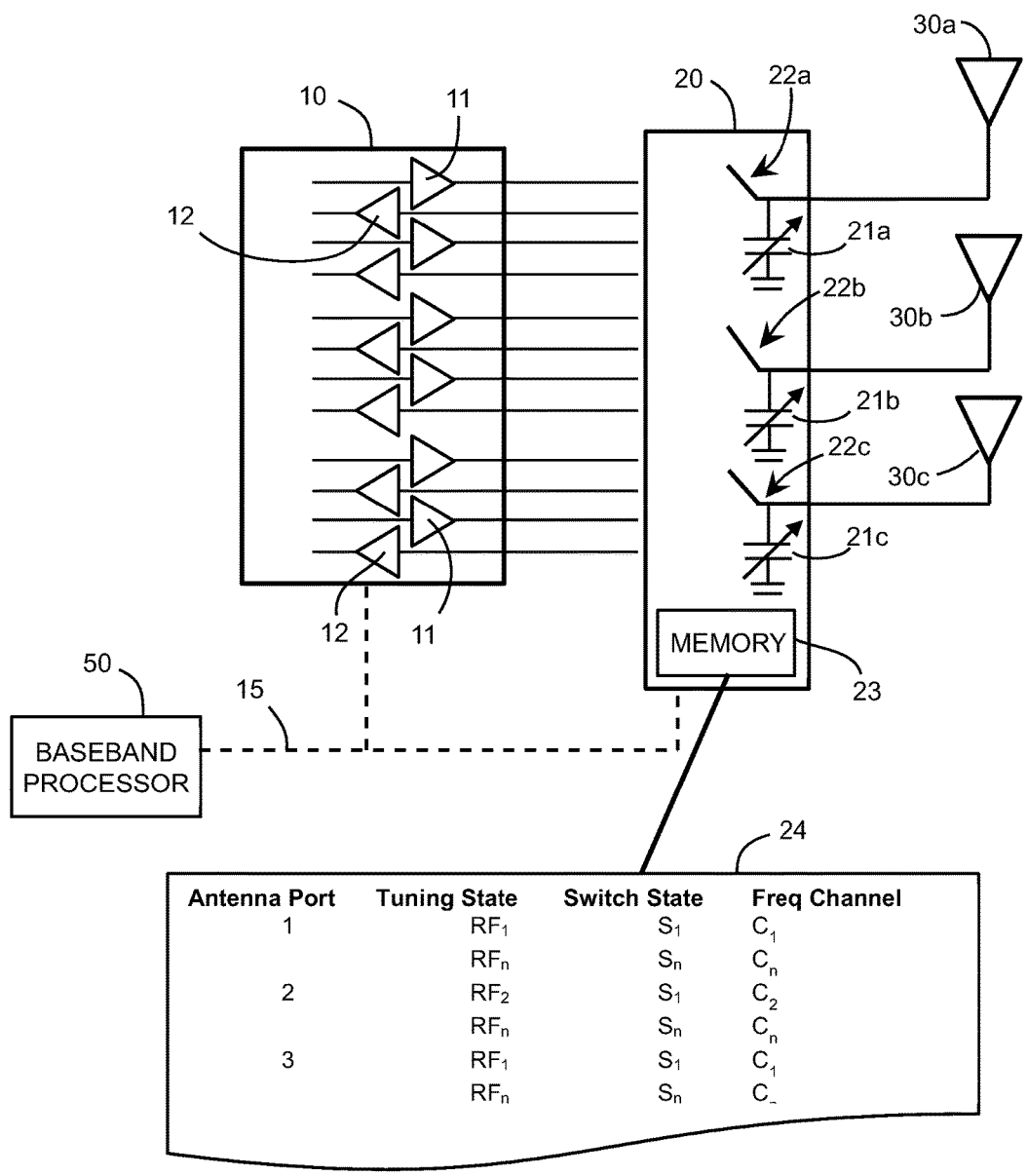
FIG. 2 shows an antenna tuning module connected to an RF front-end configured for Time Division Duplex (TDD) communication.

FIG. 2 illustrates a switch/antenna tuning module 20 connected to an RF front-end 10 configured for Time Division Duplex (TDD) communication. The switch/antenna tuning module 10 comprises three multi-port switches 22a; 22b; 22c. Each multi-port switch has a tunable capacitor 21a; 21b; 21c, respectively, associated with it. Each multi-port switch is configured to switch between a power amplifier (PA) 11 and low noise amplifier (LNA) 12. The tunable capacitor can be used to impedance match the antenna to both the PA and LNA as a function of time. Memory 23 is resident in the switch assembly 20. The three multi-port switches 22a; 22b; 22c are connected to the RF front-end module 10. Control signals 15 for the RF front-end module as well as the switch assembly are provided by a baseband processor 50. A look-up table 24 is illustrated with tuning state, switch state, and frequency channel information. FIG. 2 differs from FIG. 1 with the showing of power amplifiers 11 and low noise amplifiers 12 integrated within the RF front end module.

Figure 3:
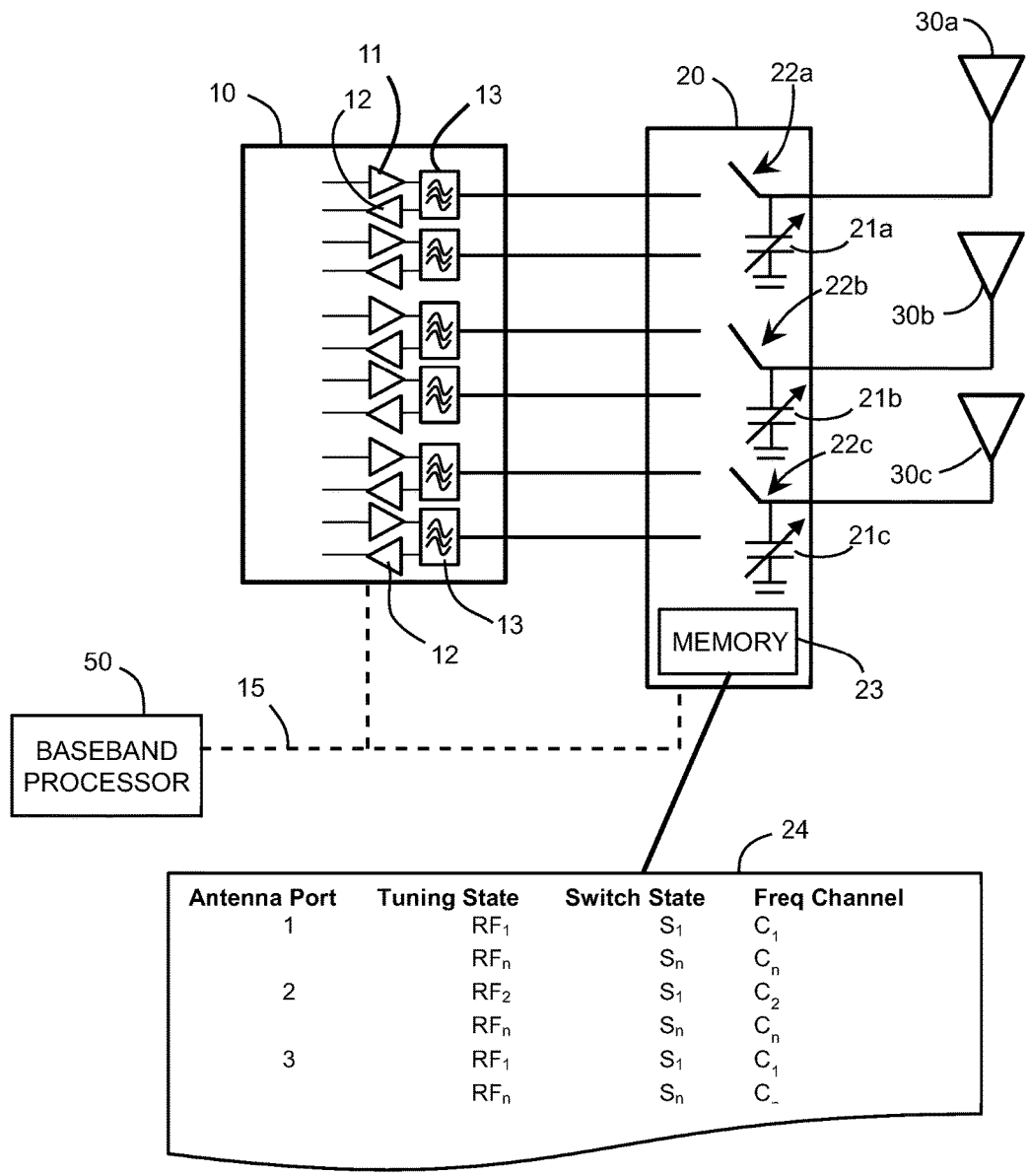
FIG. 3 shows an antenna tuning module connected to an RF front-end configured for Frequency Division Duplex (FDD) communication.

FIG. 3 illustrates a switch/antenna tuning module 20 connected to an RF front-end 10 configured for Frequency Division Duplex (FDD) communication. The switch/antenna tuning module comprises three multi-port switches 22a; 22b; 22c. Each multi-port switch has a tunable capacitor 21a; 21b; 21c associated with it. Each multi-port switch is configured to switch between a PA (power amplifier) 11 and LNA (low noise amplifier) 12, with a duplexer 13 disposed between each of the PA or LNA and an associated switch port. Memory 23 is resident in the switch assembly. Each of the three multi-port switches are connected to the RF front-end module, and further connected to an antenna 30a; 30b; 30c. Control signals 15 for the RF front-end module, as well as those for the switch assembly, are provided by a baseband processor 50. A look-up table 24 is illustrated with tuning state, switch state, and frequency channel information.

Figure 4:
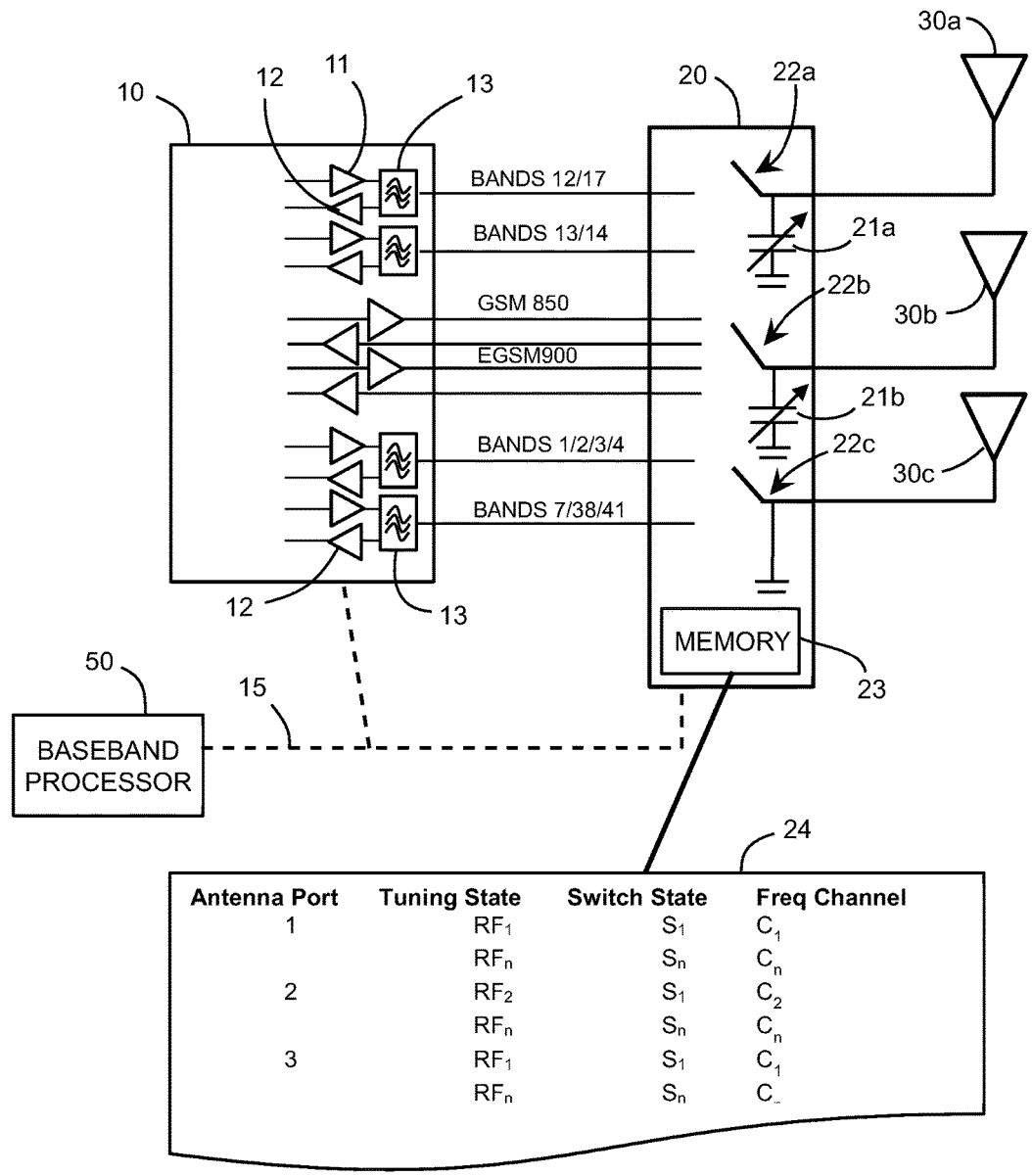
FIG. 4 shows an antenna tuning module connected to an RF front-end; a look-up table is illustrated with tuning state, switch state, and frequency channel information.

FIG. 4 illustrates a switch/antenna tuning module 20 connected to an RF front-end 10. The switch/antenna tuning module comprises three multi-port switches 22a; 22b; 22c. Frequency bands are specified per each multi-port switch, with the LTE lower frequency bands assigned to the first multi-port switch 22a, and the 850 GSM and 900 GSM bands assigned to the second multi-port switch 22b. High frequency bands are assigned to the third multi-port switch 22c. The first and second multi-port switches each have a tunable capacitor 21a; 21b associated with them. The third multi-port switch does not have a tunable capacitor associated with it. Memory 23 is resident in the switch assembly. The three multi-port switches are connected to an RF front-end module, and further connected to one of the antennas 30a; 30b; 30c. Control signals 15 for the RF front-end module as well as the switch assembly are provided by a baseband processor 50. A look-up table 24 is illustrated with tuning state, switch state, and frequency channel information.

Figure 5:
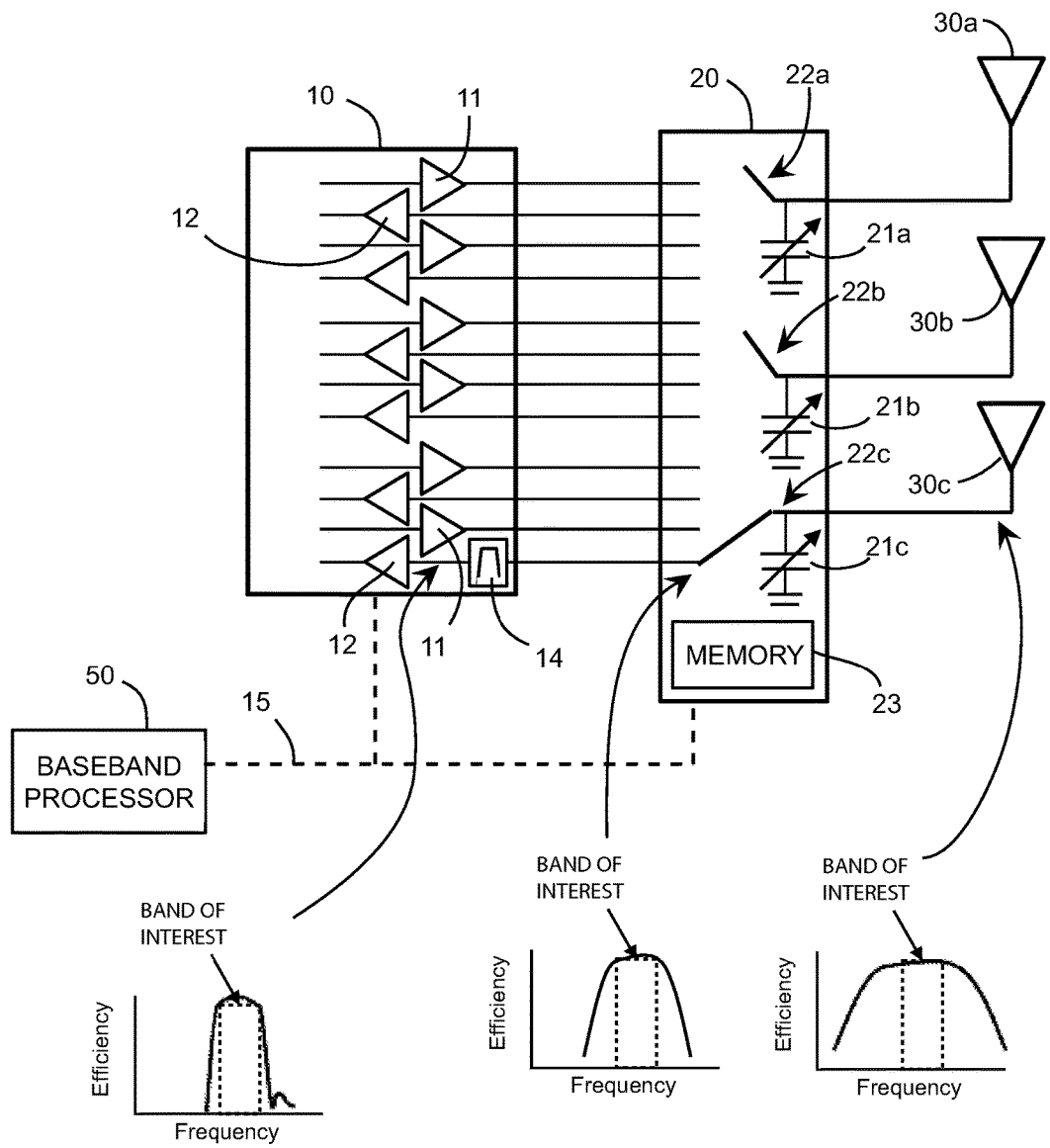
FIG. 5 illustrates a switch/antenna tuning module connected to an RF front-end 10 configured for TDD communication.

FIG. 5 illustrates a switch/antenna tuning module 20 connected to an RF front-end 10 configured for TDD communication. The tunable capacitor 21c associated with the third multi-port switch 22c is used to reduce the bandwidth of the antenna 30c connected to the third multi-port switch. A reduction of frequency bandwidth of the antenna at the switch/antenna module allows for better total system filtering and/or allows for relaxed filtering specifications from the Rx (receive) filter 14 in the RF front-end module.

Figure 6:
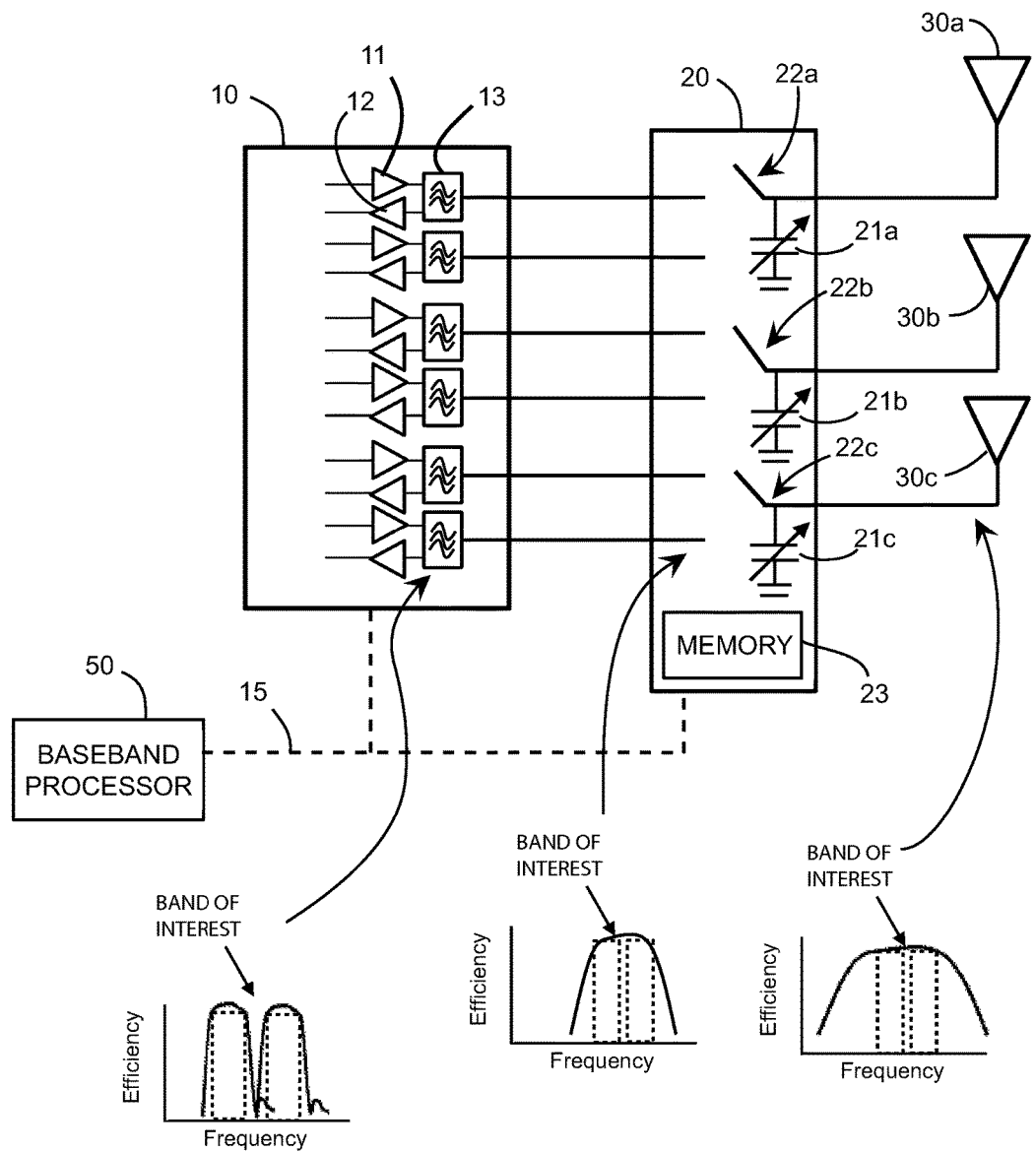
FIG. 6 illustrates a switch/antenna tuning module connected to an RF front-end 10 configured for FDD communication.

FIG. 6 illustrates a switch/antenna tuning module 20 connected to an RF front-end 10 configured for FDD communication. The RF front end module 10 includes a plurality of PA's 11, LNA's 12 and duplexers 13. The tunable capacitor 21c associated with the third multi-port switch 22c is used to reduce the bandwidth of the antenna 30c connected to the third multi-port switch. A reduction of frequency bandwidth of the antenna at the switch/antenna module allows for better total system filtering and/or allows for relaxed filtering specifications from the duplexer 13 in the RF front-end module.

Figure 7:
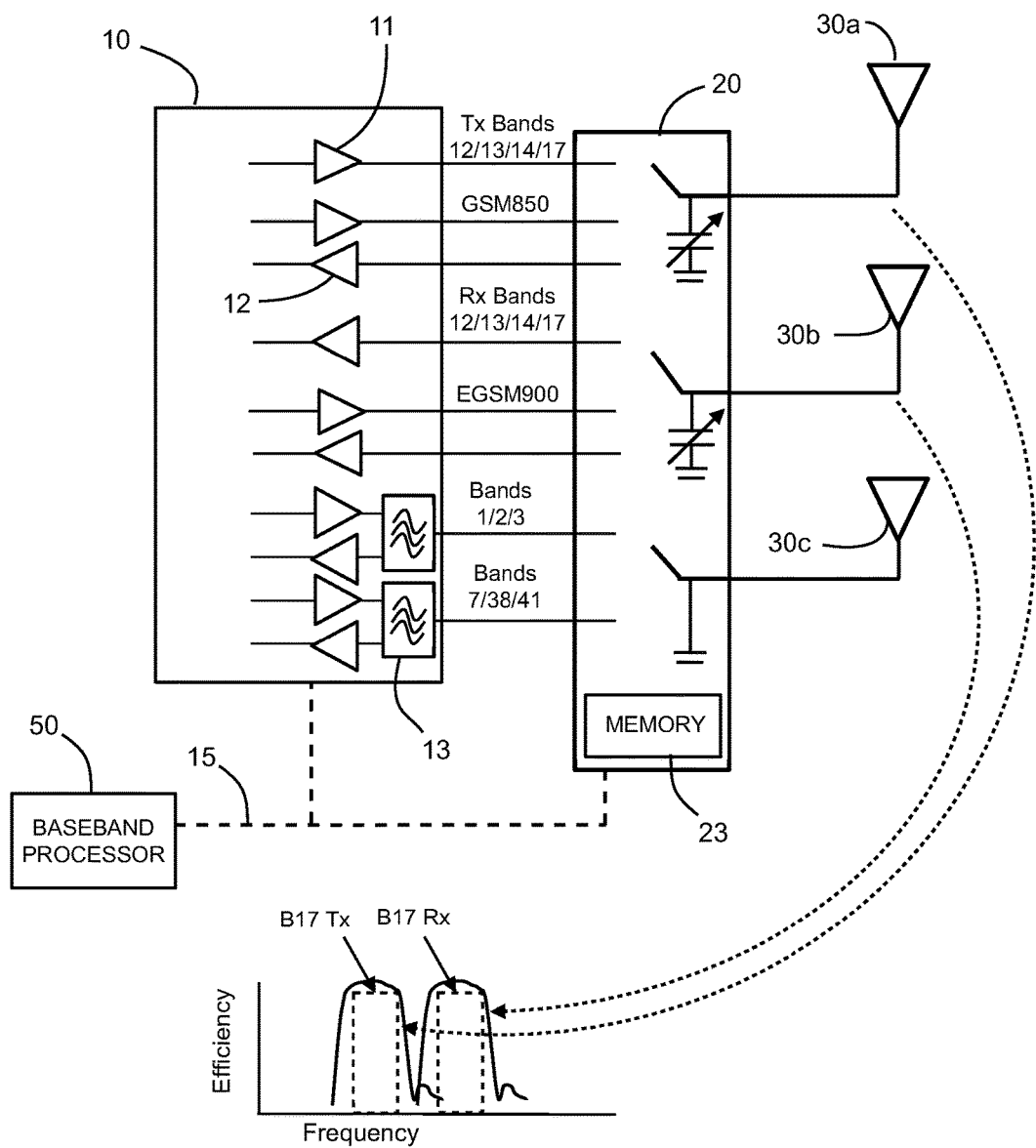
FIG. 7 illustrates a switch/antenna tuning module configured for concurrent operation of Tx and Rx frequency bands at the lower LTE bands and impedance matching of the antennas used for the LTE Tx and Rx lower frequency bands.

FIG. 7 illustrates a switch/antenna tuning module 20 connected to an RF front-end 10. The switch/antenna tuning module comprises three multi-port switches. Frequency bands are specified per multi-port switch; with the LTE lower frequency transmit bands assigned to the first multi-port switch along with the 850 GSM band. The LTE lower frequency receive bands are assigned to the second multi-port switch along with the 900 EGSM band. Six high frequency bands are assigned to the third multi-port switch. This configuration allows for concurrent operation of Tx and Rx frequency bands at the lower LTE bands and impedance matching of the antennas used for the LTE Tx and Rx lower frequency bands.

Figure 8A:
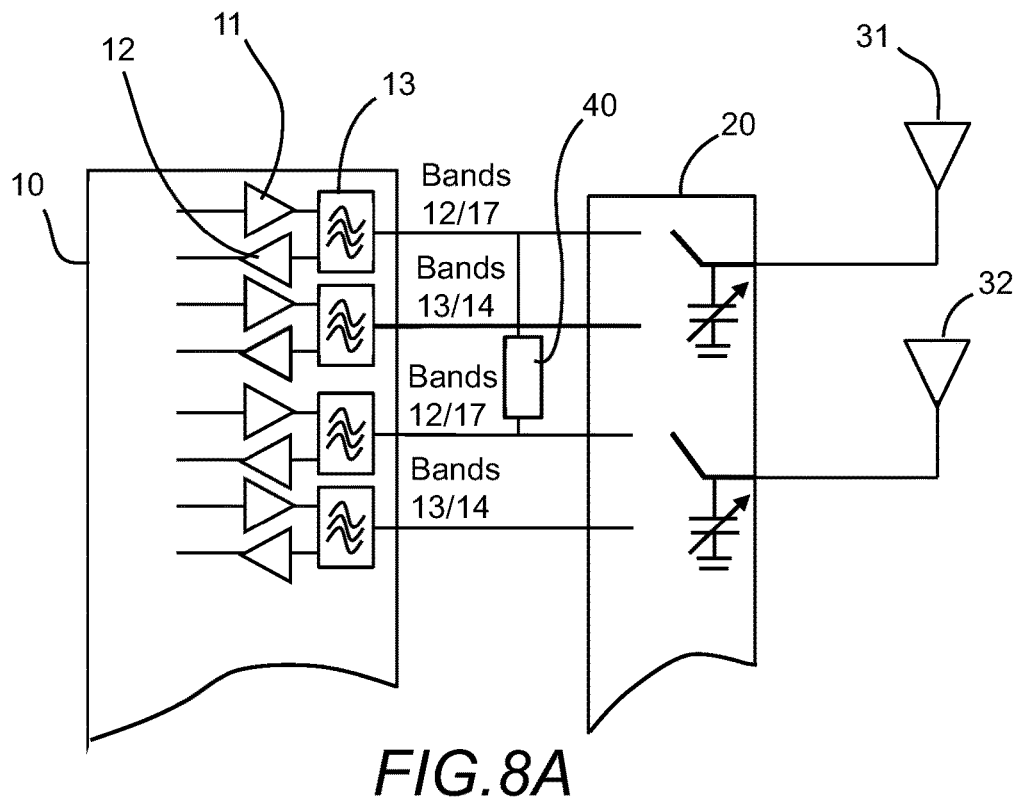
FIG. 8A illustrates an antenna system configuration wherein the antenna tuning module comprises two multi-port switches, with each switch having a tunable capacitor associated with it.
Figure 8B:
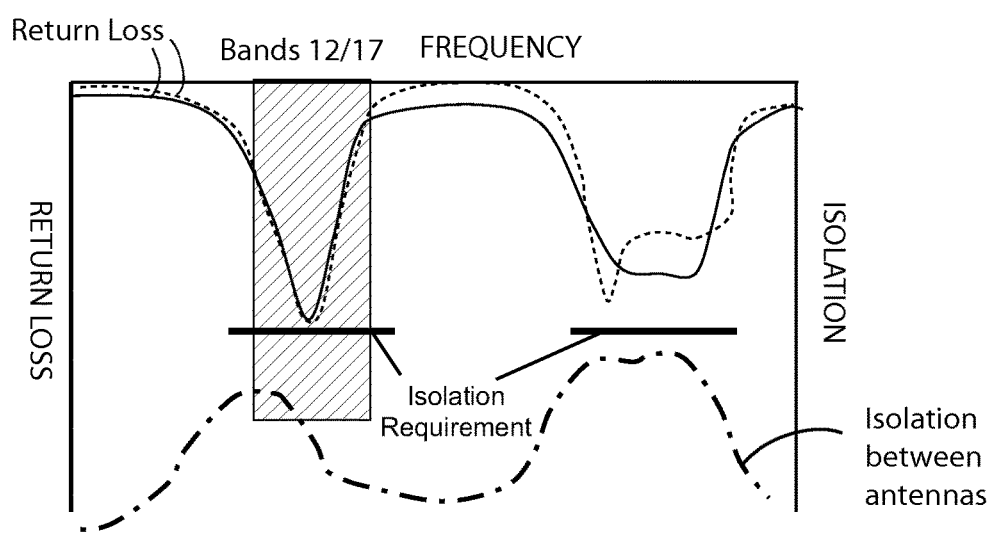
FIG. 8B shows a plot indicating the response from the antenna system as described in FIG. 8A.

FIG. 8A illustrates a system configuration wherein the switch/antenna tuning module 20 comprises two multi-port switches, with each switch having a tunable capacitor associated with it. A primary antenna 31 is connected to the common port of the first multi-port switch and a diversity antenna 32 is connected to the common port of the second multi-port switch. An impedance load 40 is used to connect one external port of the first multi-port switch and one external port of the second multi-port switch. Proper selection of the impedance properties of the impedance load can be made such that the isolation between the main and diversity antennas is improved at the frequency band of operation. A plot is shown indicating the response from the antenna system as described in FIG. 8A.

Figure 9:
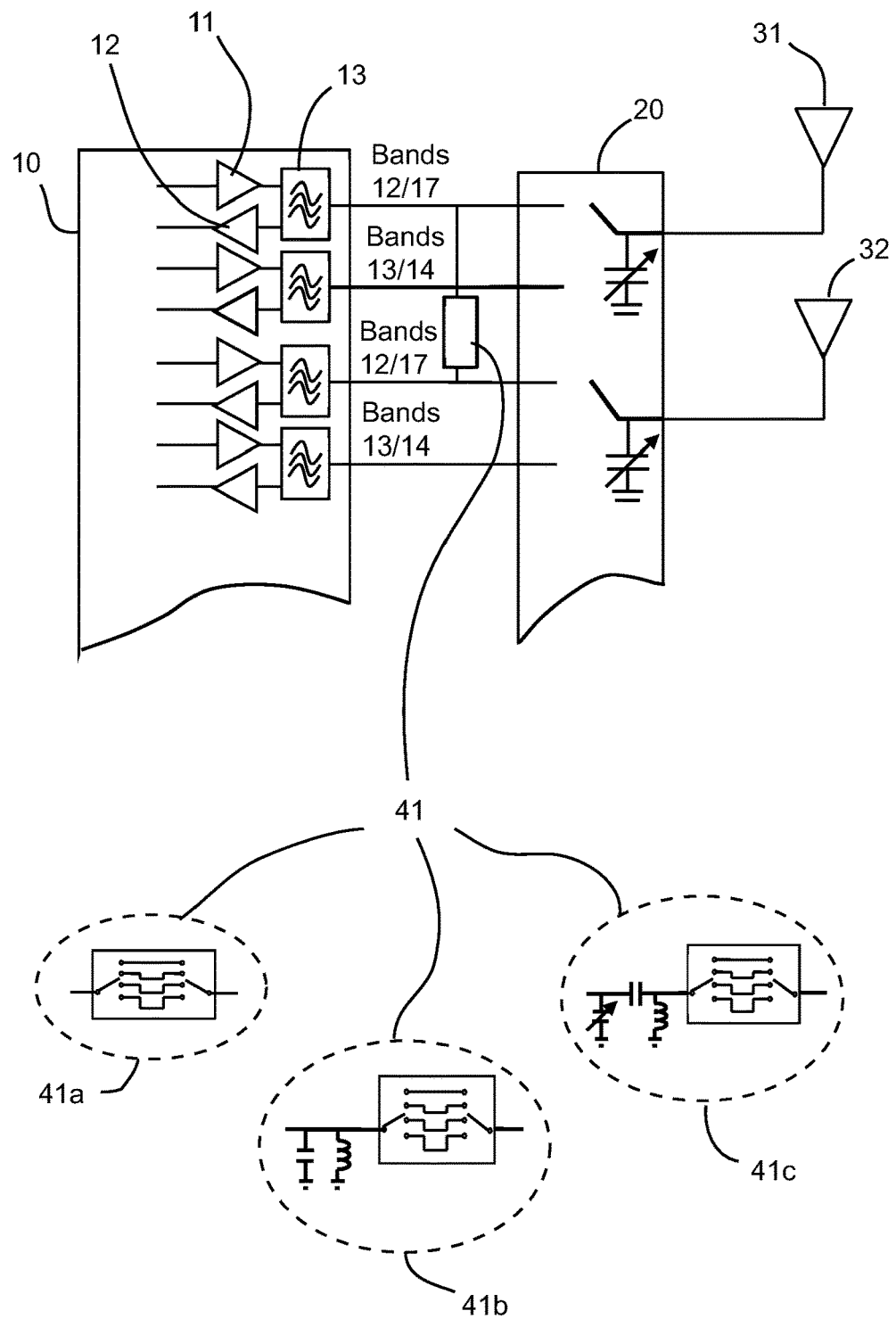
FIG. 9 illustrates circuits that can constitute the impedance load used to connect the ports from two multi-port switches to improve isolation between the antennas connected to the multi-port switches.

FIG. 9 illustrates circuits that can constitute the impedance load 41 used to connect the ports from two multi-port switches to improve isolation between the antennas connected to the multi-port switches. A phase shifter 41a configured by using two multi-port switches and transmission lines of varying lengths to connect the switches is shown. A phase shifter with a reactive circuit 41b is also shown, as well as a phase shifter with a tunable circuit 41c.

Figure 10A:
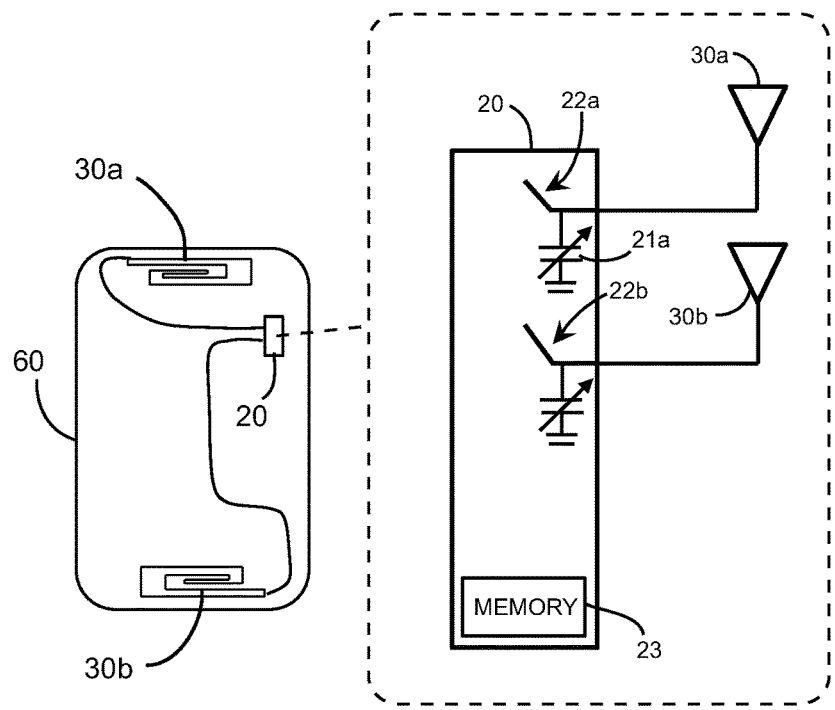
FIG. 10A illustrates a cell phone configuration containing two antennas with the first antenna being located along the top of the phone and the second antenna located along the bottom edge, and a switch assembly connected to the two antennas, the switch assembly includes an integrated tuning capability.
Figure 10B:
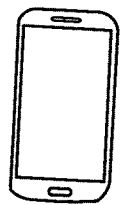
FIG. 10(B-E) illustrate four use-cases as illustrated: free space (FIG. 10B), left hand held (FIG. 10C), right hand held (FIG. 10D), and head and hand loading (FIG. 10E).
FIG. 10F shows a lookup table used to store information such as tuning state, frequency channel, switch state, and use case.
Figure 10C:
Figure 10D:
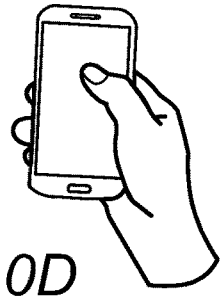
Figure 10E:
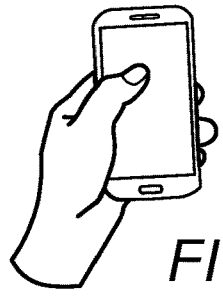
Figures 10F, 11:
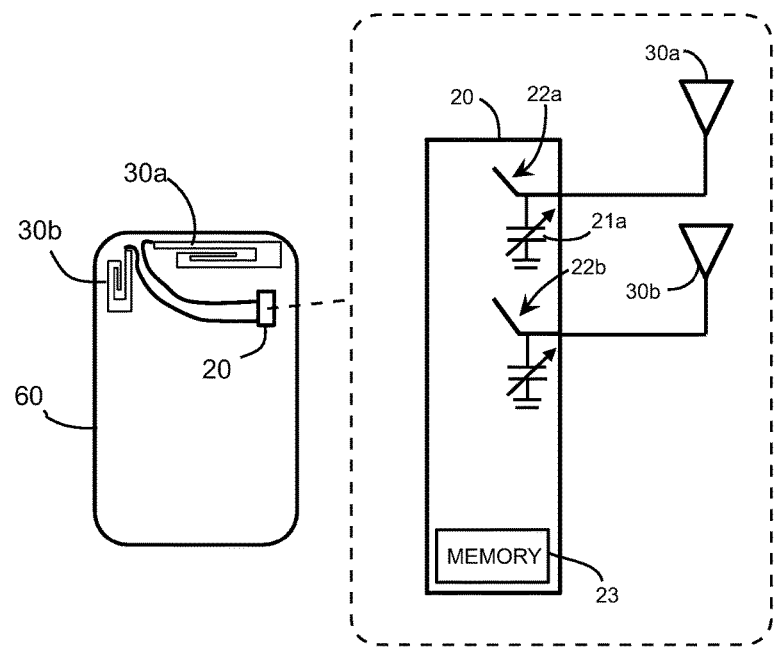
FIG. 11 illustrates a cell phone configuration containing two antennas, the first antenna being a low band antenna positioned along the top of the communication device and the second antenna being a high band antenna positioned adjacent to the first antenna.

FIG. 10A illustrates a cell phone configuration containing two antennas 30a; 30b, with the first antenna 30a being located along the top of the phone and the second antenna 30b located along the bottom edge. A multi-port switch assembly containing two tunable capacitors, one capacitor associated with each of the two switches connected to the two antennas 30a; 30b, is used to connect the RF front-end (not shown) to the two antennas. FIG. 10(B-E) illustrate four use-cases as illustrated: free space (FIG. 10B), left hand (FIG. 10C), right hand (FIG. 10D), and head and hand (FIG. 10E). A look-up table is shown in FIG. 10F which contains data relating to antenna ports, frequency channels, tunable capacitor state, switch state, and use case. Information in the look-up table is used to tune the antennas of FIG. 10A for specific uses cases as shown and described.

FIG. 11 illustrates a cell phone configuration containing two antennas, the first antenna 30a being a low band antenna positioned along the top of the communication device 60 and the second antenna 30b being a high band antenna positioned adjacent to the first antenna. An antenna tuning module 20 containing two multi-port switches 22a; 22b each associated with one of two tunable capacitors 21a; 21b, with the two switches connected to the two antennas, is used to connect the RF front-end to the two antennas. The antenna tuning module contains memory 23 for storing a lookup table. Four use cases as previously illustrated: free space, left hand, right hand, and head and hand each correspond to data in the lookup table and preferred modes or configurations of the antenna tuning module. The look-up table as shown in FIG. 10F contains data relating to antenna ports, frequency channels, tunable capacitor state, switch state, and use case, which data is stored in the memory 23. Information in the look-up table is used to tune the antennas for the specific uses cases.

Figure 12A:
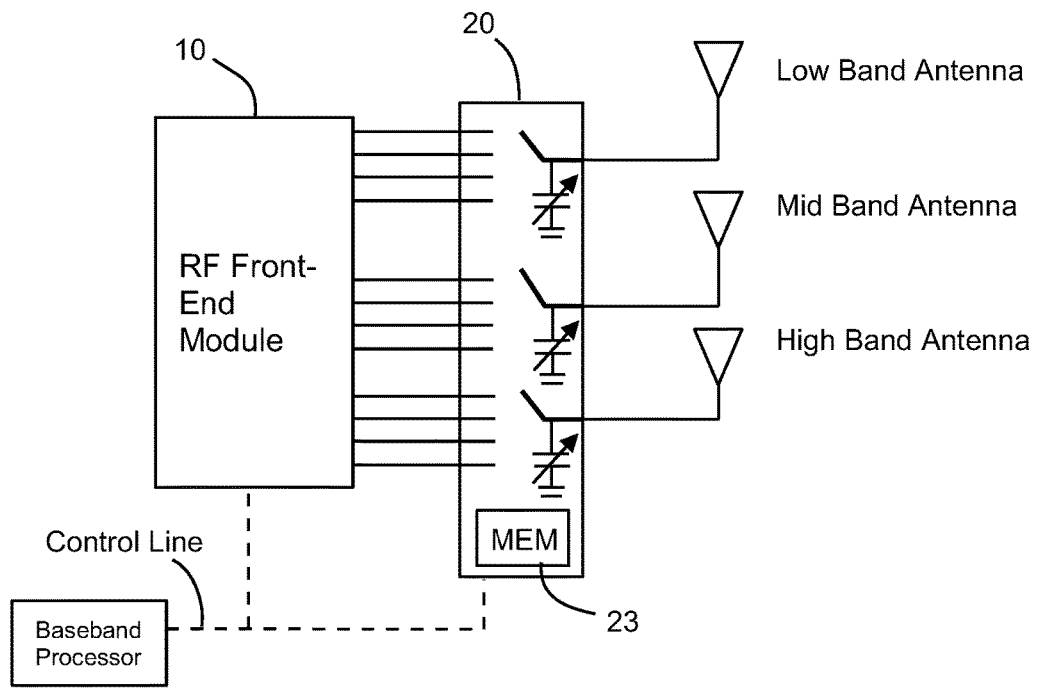
FIG. 12A illustrates a switch assembly with three antennas (low band, mid band, high band).
Figure 12B:
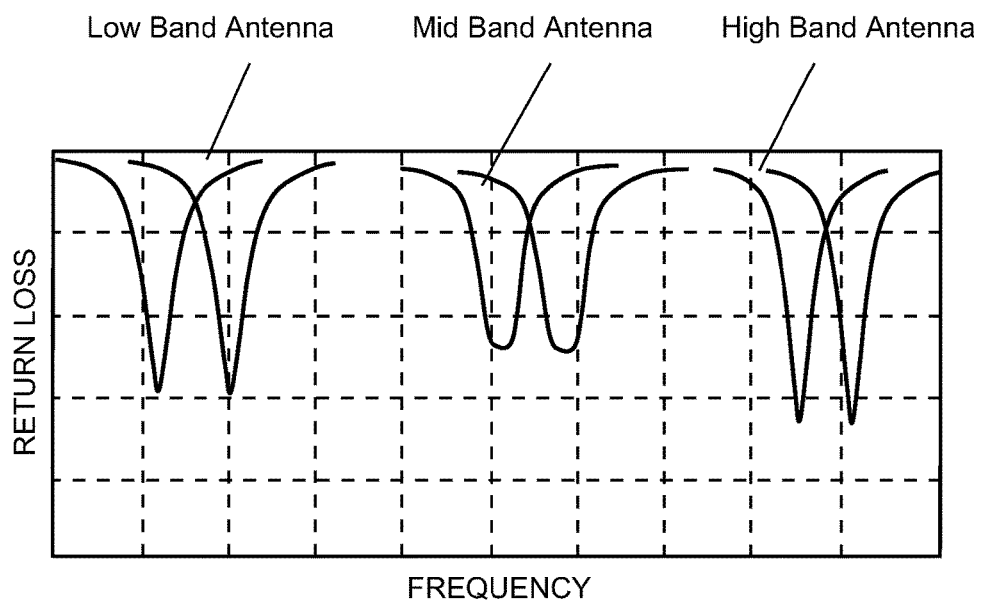
FIG. 12B shows a plot of frequency vs. return loss for each of the low band, mid-band, and high-band antennas.

FIG. 12A illustrates a switch/antenna tuning module 20 with three antennas. The first antenna is configured for low band frequencies, the second antenna is configured for mid-band frequencies, and the third antenna is configured for high band frequencies. Each multi-port switch of the antenna tuning module contains an associated tunable capacitor, resulting in a configuration where all three antennas can be tuned simultaneously. FIG. 12B shows a plot of frequency vs. return loss for each of the low band, mid-band, and high-band antennas.

REFERENCE SIGNS LIST

RF front end module (10)
Power amplifier (11)
Low noise amplifier (12)
Duplexer (13)
Receive filter (14)
Control lines (15)
Switch assembly OR antenna tuning module (20)
Tunable capacitor (21a; 21b; 21c)
Multi-port switch (22a; 22b; 22c)
Memory (23)
Look-up table (24)
Antennas (30a; 30b; 30c)
Impedance load (40)
Impedance load circuit (41)
Phase shifter (41a)
Phase shifter with reactive circuit (41b)
Phase shifter with tunable circuit (41c)
Base band processor (50)
Communications device (60)

The invention claimed is:

1. An integrated circuit for use in a radio frequency communication system, comprising:
a first multiport switch configured to selectively couple a first antenna with at least one of a plurality of paths associated with a first band in a front end module;
a second multiport switch configured to selectively couple a second antenna with at least one of a plurality of paths associated with a second band in a front end module, the second band being different from the first band;
a first tunable component coupled to the first multiport switch, the first tunable component configured to vary an impedance associated with the first multiport switch;
a second tunable component coupled to the second multiport switch, the second tunable component configured to vary an impedance associated with the second multiport switch; and a memory storing switch state data for the first multiport switch and the second multiport switch and tuning state data for the first tunable component and the second tunable component;

wherein a common port of the first multiport switch is connected to the first antenna;

wherein a common port of the second multiport switch is connected to the second antenna; and wherein an impedance load connects an external port of the first multiport switch with an external port of the second multiport switch at a location opposite to the common port of the first multiport switch and the common port of the second multiport switch.

2. The integrated circuit of claim 1, wherein the first multiport switch is operable to switch between a first path having a power amplifier and a second path having a low noise amplifier.

3. The integrated circuit of claim 2, wherein the front end module further comprises a duplexer.

4. The integrated circuit of claim 1, wherein the impedance load comprises a phase shifter.

5. The integrated circuit of claim 4, wherein the phase shifter comprises a plurality of transmission lines, each transmission line having a different length.

6. The integrated circuit of claim 1, wherein the first multiport switch,—and the second multiport switch are adapted to be coupled with a processor to receive control signals for configuring a switch state of the first multiport switch or the second multiport switch based at least in part on the switch state data.

7. The integrated circuit of claim 1, wherein the first tunable component and the second tunable component are adapted to be coupled with a processor to receive control signals for configuring a tuning state of the first multiport switch or the second multiport switch based at least in part on the tuning state data.

8. The integrated circuit of claim 1, wherein the second multiport switch is operable to switch between a first path having a power amplifier and a second path having a low noise amplifier.

9. The integrated circuit of claim 1, wherein the second antenna is a diversity antenna.

10. The integrated circuit of claim 1, wherein the memory stores use case data associated with different use cases associated with the radio frequency communication system.

* * * * *